United States Patent
Burchill, Jr.

(10) Patent No.: US 8,383,238 B2
(45) Date of Patent: Feb. 26, 2013

(54) HIGHLY POROUS COATED FINE PARTICLES, COMPOSITION, AND METHOD OF PRODUCTION

(76) Inventor: G. Stuart Burchill, Jr., Naples, FL (US)

(*) Notice: Subject to any disclaimer, the term of this patent is extended or adjusted under 35 U.S.C. 154(b) by 821 days.

(21) Appl. No.: 11/909,441

(22) PCT Filed: Mar. 22, 2006

(86) PCT No.: PCT/US2006/010698
§ 371 (c)(1),
(2), (4) Date: Sep. 21, 2007

(87) PCT Pub. No.: WO2006/102568
PCT Pub. Date: Sep. 28, 2006

(65) Prior Publication Data
US 2010/0140532 A1    Jun. 10, 2010

Related U.S. Application Data

(60) Provisional application No. 60/663,737, filed on Mar. 22, 2005, provisional application No. 60/665,932, filed on Mar. 29, 2005.

(51) Int. Cl.
B32B 5/16 (2006.01)
E04B 1/74 (2006.01)
B05D 7/00 (2006.01)

(52) U.S. Cl. ......... 428/404; 428/402; 428/403; 252/62; 427/215; 427/219

(58) Field of Classification Search ............. 252/62
See application file for complete search history.

(56) References Cited

U.S. PATENT DOCUMENTS

| | | | | | |
|---|---|---|---|---|---|
| 2,093,454 | A | * | 9/1937 | Kistler | 423/338 |
| 2,870,109 | A | * | 1/1959 | Nickerson | 524/266 |
| 3,769,770 | A | * | 11/1973 | Deschamps et al. | 52/404.1 |
| 5,270,027 | A | * | 12/1993 | Balducci et al. | 423/338 |
| 5,313,485 | A | | 5/1994 | Hamil et al. | |
| 5,409,683 | A | | 4/1995 | Tillotson et al. | |
| 5,565,142 | A | | 10/1996 | Deshpande et al. | |
| 5,656,195 | A | * | 8/1997 | Mielke et al. | 252/62 |
| 6,132,837 | A | | 10/2000 | Boes et al. | |
| 6,613,383 | B1 | | 9/2003 | George et al. | |
| 6,806,299 | B2 | | 10/2004 | Baumann et al. | |
| 6,913,827 | B2 | * | 7/2005 | George et al. | 428/402 |
| 2002/0064642 | A1 | * | 5/2002 | Albert et al. | 428/315.5 |
| 2003/0215640 | A1 | * | 11/2003 | Ackerman et al. | 428/405 |

OTHER PUBLICATIONS

Elam et al., "Viscous flow reactor with quartz crystal microbalance for thin film growth by atom layer deposistion", Review of Scientific Instruments, 2002, 73(8), 2981-2987.*
Lide, David R. (editor), "CRC Handbook of Chemistry and Physics. 91st Edition. Internet Version 2011". Section 6: Fluid Properties; Thermal Conductivity of Gasses.*
Lide, David R. (editor), "CRC Handbook of Chemistry and Physics. 91st Edition. Internet Version 2011". Section 12: Properties of Solids; Thermal Conductivities of Ceramics and Other Insulating Materials.*
Lide, David R. (editor), "CRC Handbook of Chemistry and Physics. 91st Edition. Internet Version 2011". Section 14: Geophysics, Astronomy, and Acoustics; U.S. Standard Atmosphere (1976).*
Hausmann et al., "Rapid Vapor Deposition of Highly Conformal Silica Nanolaminates", Science, 2002, vol. 298, pp. 402-406.

* cited by examiner

*Primary Examiner* — Humera Sheikh
*Assistant Examiner* — Thomas Mangohig
(74) *Attorney, Agent, or Firm* — Westerman, Hattori, Daniels & Adrian, LLP

(57) ABSTRACT

Fine particles of a highly porous, low density material in which the pore chambers have been at least partially evacuated and refilled with a gas having a low thermal conductivity, and the obtained particles are encapsulated with a protective, durable coating. The particles are particularly useful as durable thermal insulating material.

20 Claims, 1 Drawing Sheet

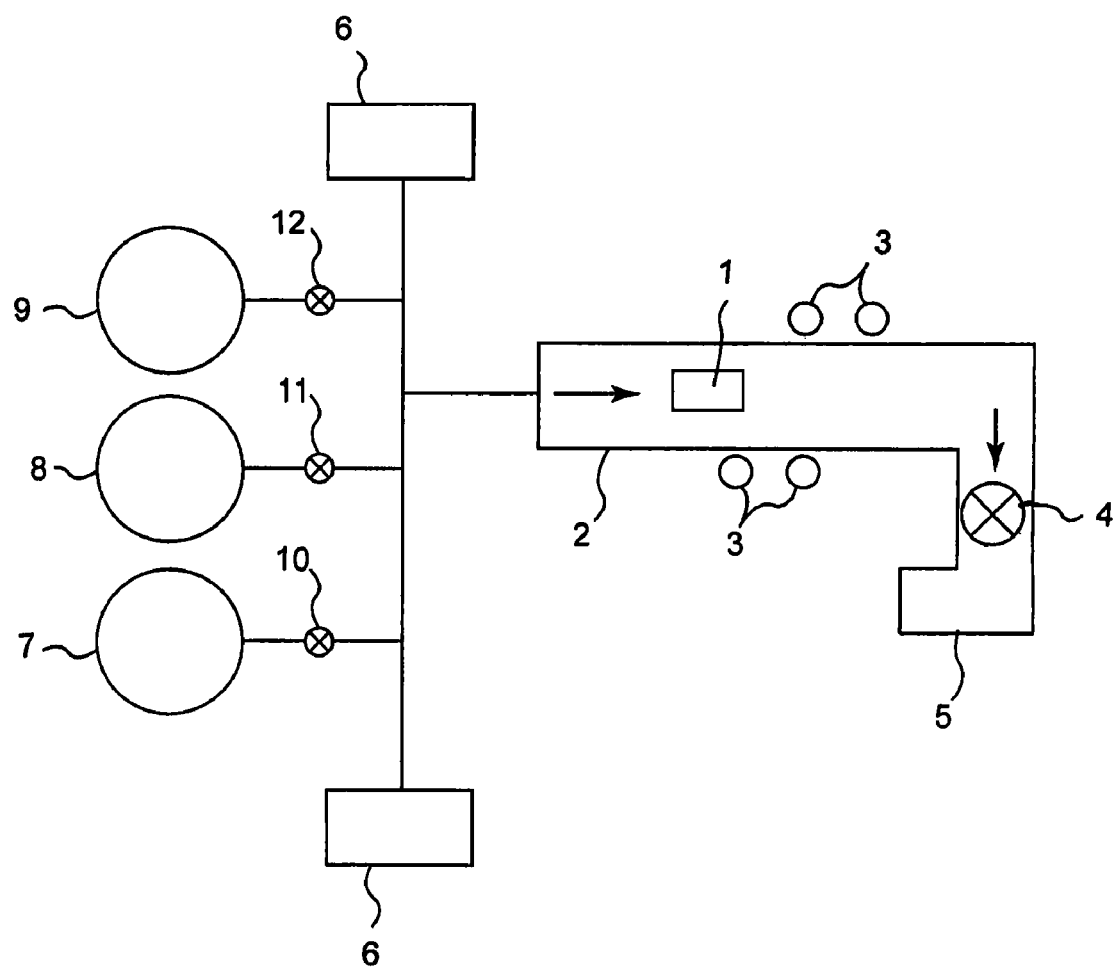

HIGHLY POROUS COATED FINE PARTICLES, COMPOSITION, AND METHOD OF PRODUCTION

CROSS-REFERENCE TO RELATED APPLICATION

This application claims priority based on U.S. provisional application No. 60/663,737, filed Mar. 22, 2005, and U.S. provisional application No. 60/665,932, filed Mar. 29, 2005, which are incorporated herein by reference.

BACKGROUND

The present invention relates to a material comprised of particles of a highly porous, low density material in which the pore chambers have been at least partially evacuated and refilled with a gas having a low thermal conductivity, and the obtained particles are encapsulated with a protective and durable coating. The invention also relates to such particles, compositions and articles comprising such particles, and methods for producing the particles. The material of the invention is particularly useful as durable thermal insulating material.

One known group of highly porous, low-density material which has very low thermal conductivity consists of the materials commonly referred to as "aerogels" or "xerogels", which terms will be used interchangeably in the description of the present invention. In its conventional meaning, the term "aerogel" is used to describe a material obtained by drying a wet sol-gel at temperatures above the critical temperature and at pressures above the critical pressure. Under such conditions, the removal of the gel liquid, for example, water, from the sol-gel results in a porous structure without damaging the structure of the gel, so that a high porosity is obtained. Traditionally, the product obtained by drying at conditions below supercritical conditions is known as a "xerogel", which has a lower porosity, with at least some of the pore structure being damaged during the drying process. Since the process of drying under supercritical conditions is very energy intensive and costly, attempts have been made to produce xerogels which approximate the properties of aerogels. For example, U.S. Pat. No. 5,565,142 describes "an extremely porous xerogel dried at vacuum-to-below supercritical pressures but having the properties of aerogels which are typically dried at supercritical pressures. This is done by reacting the internal pore surface of the wet gel with organic substances in order to change the contact angle of the fluid meniscus in the pores during drying."

Silica aerogels were the first extensively studied aerogels. However, aerogels and xerogels may be made with a wide range of chemical compositions. In addition to inorganic aerogels other than silica aerogels, there are organic aerogels prepared from organic polymers and sometimes called "carbon aerogels."

Aerogels and xerogels can also be surface treated to alter their properties. For example silica aerogel can be made less hydrophilic by converting the surface —OH groups into —OR groups (wherein R is an aliphatic group). U.S. Pat. No. 6,806,299, the content of which is incorporated herein by reference in its entirety, discloses the preparation of hydrophobic organic aerogels.

Aerogels are known to have excellent thermal insulation properties, and xerogels having a porosity and pore structure approximating those of aerogels are also good insulators. Aerogels and xerogels have been the subject of scientific and commercial investigation for use as the thermally insulating component of a variety of thermal barriers and in a variety of applications. Examples of current commercially available aerogel forms include fine particles, beads, or slabs at ambient air pressure. However, the optimal thermal resistance values of aerogels are obtained when they are in a vacuum. Aerogels in the form of fine particles, beads, chunks, blocks, or slabs have been vacuum sealed in plastic wrap or containers, for example, as described in U.S. Pat. No. 6,132,837. These "shrink wrapped" or vacuum-sealed forms of aerogel insulating material are relatively large, as compared to the individual particles. They are not as versatile in that they cannot be incorporated or blended into different medium in the same manner as the particles. These pieces are not readily usable in the construction business, in industrial settings, or for installation by consumers.

The unwrapped forms of aerogel insulating material described above suffer from a lack of durability, and cannot be used in harsh environments or in the presence of abrasive materials. They also suffer from absorption into the aerogel pores of moisture, oils, etc., with a corresponding loss of thermal resistance due to increased overall density and thermal conductivity. The shrink-wrapped form of aerogel insulating material experiences loss of vacuum over time, with a corresponding loss of thermal resistance.

SUMMARY OF THE INVENTION

The present invention overcomes the deficiencies inherent in the use of highly porous material such as aerogels for insulation as known in the prior art.

One goal of the present invention is to provide insulation in the form of discrete units, i.e., particles of a highly porous, low density material, in which the air in the pore chambers has been at least partially evacuated and a gas having a low thermal conductivity approaching zero has been introduced into the pore chambers, which particles are then encapsulated in a durable, abrasion resistant, extremely thin coating of material which itself has an inherent low thermal conductivity. In the case the highly porous, low density material is an aerogel or xerogel, the coated discrete units of the thus treated aerogel or xerogel are characterized by a thermal conductivity approaching that of an aerogel or a xerogel in a perfect vacuum, approximately 0.008 W/mK, as opposed to that of an air-filled aerogel or xerogel at ambient pressure, approximately 0.017 W/mK. The coated particles are further characterized by high resistance to abrasion, shear, or penetration of the internal pore structure of the aerogel or xerogel by any material which would reduce the thermal resistance of the aerogel or xerogel structure.

Another goal of the present invention is to provide a composition comprising the coated and treated porous particles described above, and methods for preparing such particles and such compositions.

BRIEF DESCRIPTION OF THE DRAWINGS

FIG. 1 is a schematic diagram depicting a viscous flow reactor for atomic layer deposition for preparing an embodiment of the coated particles according to the invention.

DESCRIPTION OF THE INVENTION

The present invention provides insulating material in the form of discrete units or particles of highly porous material in which the air in the pore chambers has been at least partially evacuated and a gas having a low thermal conductivity approaching zero has been introduced into the pore chambers, and the particles are then encapsulated in a durable, abrasion resistant, extremely thin coating of material which itself has an inherent low thermal conductivity. The obtained particles are referred to as "finished particles" in the present application.

(i) The Particles of Highly Porous Material

The highly porous particles used in the invention are made of a material which is obtained by drying a sol-gel, and have a porosity of at least 80% and a particle size in the range from 1 µm to 5.0 mm. The chemistry and the production of such materials derived from a sol-gel are well documented in the chemical literature, which discloses various methods for drying the sol-gel and for modifying its surface properties. Such material includes, but is not limited to, aerogels and xerogels.

Aerogels, and xerogels which have the required high porosity approximating the porosity of aerogels are suitable for use in the present invention. Specifically, inorganic aerogels, such as silica aerogels, and other inorganic aerogels may be used, as well as aerogels prepared from organic polymers, sometimes called "carbon aerogels." Inorganic xerogels and organic xerogels are also suitable for use in the present invention, provided that they have properties similar to aerogels. Chemically modified aerogels are also suitable for use in the present invention, as well as chemically modified xerogels that have properties similar to those of aerogels.

The highly porous particles suitable for the invention include, but are not limited to, aerogel particles prepared by a process wherein the wet sol-gel is dried under supercritical pressure, and xerogel particles prepared by a process wherein the wet sol-gel is dried at a pressure below the supercritical pressure. Particles of amorphous silica aerogels or xerogels may be used, as well as particles of carbon aerogels or xerogels.

The size of the highly porous particles suitable for this invention is in the range of from 1 µm to about 5.0 mm. In one embodiment of the invention, ultrafine particle are used which have a particle size in the range from 1 µm to 1,200 µm, preferably from 1 µm to 500 µm, and more preferably from 1 µm to 15 µm. In another embodiment of the invention, particles having a size in the range from about 1.0 mm to about 5.0 mm are used.

The highly porous particles used in the invention have a porosity of at least 80%, and preferably at least 90%, the porosity being a measure of the proportion of the volume of the particles that is taken up by air.

The shape of the particles is not particularly limited and includes irregular shapes as well as smooth and symmetrical shapes.

The highly porous particles typically have small pores with a pore size not exceeding 50 nm. In an embodiment of the invention, the particles are characterized by a pore size of about 20 nm.

By virtue of having a high porosity as well as a small particle size, the particles suitable for use in the invention have a high surface area, for example in the range from 600 to 800 $m^2/g$.

The aerogel or xerogel from which the highly porous particles are made may be hydrophobic or hydrophilic. In one embodiment of the invention, the aerogel or xerogel is a non-metal oxide aerogel or xerogel in which the hydrogen atom in terminal —OH groups is substituted by a non-polar group which imparts hydrophibicity to the aerogel or xerogel. In another preferred embodiment, the aerogel or xerogel is a carbon aerogel or xerogel of an organic compound, in which the hydrogen atom in terminal —CH groups is substituted by a non-polar group which imparts hydrophibicity to the aerogel or xerogel.

The aerogels and xerogels suitable for use in the invention may be prepared by methods known in the art, and are available from commercial suppliers.

(ii) The Replacement Gas.

Any gas having a low thermal conductivity approaching zero may be used to replace the air in the pore chambers. The selection of the gas may be made by those of ordinary skill in the art in view of the specific applications, taking into consideration the additional factors of cost, toxicity, influence of the molecular weight of the gas on the thickness of the specific coating material deposited on the aerogel, etc. Nitrogen has a sufficiently low conductivity (0.0002598 W/cmK) for certain applications and has the advantage of being commonly available. Xenon is preferred for some applications because it has a very low thermal conductivity of 0.0000569 W/cmK, is chemically inert, and is economically priced. Krypton is also suitable, having a slightly higher thermal conductivity than xenon, but a lower price. Radon has an even lower thermal conductivity than xenon and krypton, and may be used in applications where the risk of exposure to humans is minimal.

(iii) The Protective Coating.

The material for the protective coating is characterized by the ability to form a continuous, strong and impermeable protective shell around the highly porous particle, in the desired thickness in the range of 5 nm-0.5 mm. This material must have a low thermal conductivity. The coating material is selected to have a melting point sufficiently higher than the maximum temperature of the environment and application for which the finished particles are used. Suitable compounds from which the coating material may be selected include ethyl cellulose, ethylene vinyl acetate, hydroxypropylmethyl cellulose phthalate, waxes, acrylic resins, epoxy resins, other synthetic polymers, metal oxides, and the family of polymers described as poly-para-xylylene polymers (known by the generic name parylene) commonly used as conformal coatings.

The material for the protective coating is selected taking into consideration the following factors: the desired level of low thermal conductivity, the abrasion resistance and impact resistance required of the finished particles, and the nature of the product into which the finished particles will be incorporated as the principal constituent material. The thickness of the coating is determined taking into consideration the size of the substrate particle, the thermal conductivity of the coating material, and the desired end use for the particles. The total volume of the coating should be smaller than the volume of the substrate particle, preferably not more than 50% of the volume of the particle, and more preferably not more than 20% of the volume of the particle.

$SiO_2$ is a preferred embodiment of the protective coating. Through atomic layer deposition $SiO_2$ can be applied to form a layer of a thickness of at most 40 nm, preferably 20 nm, and more preferably in the range of 12-14 nanometers, so that its inherent thermal conductivity has insignificant impact on the thermal insulating properties of the finished particles. The most significant characteristics of $SiO_2$ for this application are that $SiO_2$ provides a hermetic seal around the particles, has a melting point (1830° C.) that is higher than the melting point of the coated particles, has excellent resistance to thermal shock, relatively high tensile strength, relatively high compressive strength, and can be surface modified to be hydrophobic, hydrophilic, or neutral, which is a further important characteristic for this application.

(iv) Preparation of Finished Particles

Known methods for applying thin Win continuous coatings to small particles may be used for preparing the finished particles. Examples are known methods for encapsulating medicinal particles in a coating of a specific and uniform thickness to control the rate of release of the medicine to the body after ingestion. Such methods include fluidized bed coating, powder blending, mechanofusion processing, and application of the coating as a fine mist using high velocity gas flow to keep the particles in suspension and in motion. In using any of these methods to coat the particles of the invention, the coating materials are distinguished from those used in the pharmaceutical industry in that they are not designed to degrade, but are selected so as to retain their structural integrity over time, and provide a permanent, continuous protective coating around the particles. Other examples of suitable coating methods are those used in the electronic industry for depositing thin layers in the fabrication of semiconductor devices, for example chemical vapor deposition.

The specific coating process is selected taking into consideration the nature of the coating material, which itself is determined by the end use application of the particle and the volume of particulate product required for the application.

In an embodiment of the process for preparing the finished particles, the highly porous particles are placed in a closed chamber used for the coating process. The chamber is evacuated. Then the exchange gas, for example nitrogen or xenon, is introduced into the chamber. The coating material, or one or more precursor for the coating material, is then introduced into the closed chamber without introducing air or releasing the exchange gas. The coating of the particles in the closed chamber is initiated and carried out until completion. Upon completion of the coating process, the exchange gas which was not encapsulated in the particles, the unused coating material or precursor, and any reaction products are evacuated from the chamber. Finally, air is reintroduced into the chamber until the pressure is at ambient level, the chamber is opened, and the finished particles are collected.

A preferred embodiment of the process for coating the porous particles is the special chemical vapor deposition method known as atomic layer epitaxy or atomic layer deposition (ALD). In the ALD process, the substrate is exposed sequentially to each of two or more gaseous reactants, in contrast to conventional chemical vapor deposition in which the substrate is exposed to all the gaseous reactants simultaneously. By limiting the substrate exposure to a single gaseous reactant which undergoes a self-limiting reaction at the surface of the substrate, it is possible to control the characteristics of each deposited layer and of the final coating resulting from the sequential exposure to all the gaseous reactants. ALD has been further developed for specific use in coating particles. Examples of such particle coating by ALD are described in U.S. Pat. Nos. 6,613,383 and 6,713,177, which are incorporated therein in their entireties.

In a preferred embodiment of the invention, the highly porous particles are coated with a thin layer of $SiO_2$. The $SiO_2$ may be deposited on the porous particles by ALD using precursors for $SiO_2$ deposition, for example triethyl aluminum combined with tris (tert-butoxy) silanol, as described in Hausman et al., "Rapid Vapor Deposition of Highly Conformal Silica Nanolaminates", Science, 2002, 298, 402-406. In this preferred embodiment, the openings of the pores of the porous particles are sealed and the outer surfaces of the porous particles are simultaneously coated with a layer of $SiO_2$ approximately 10-12 nanometers thick. The initial surface reaction with trimethyl aluminum deposits Al on the surface of the porous particles, providing a catalytic surface for the subsequent atomic layer deposition of $SiO_2$ from a silicon precursor. Examples of the silicon precursor are tris (tert-butoxy) silanol, tris(tert-pentoxy) silanol, and tris (iso-propoxy) silanol. The ALD is conducted in an inert gas atmosphere consisting of the exchange gas. The pores of the finished particles contain the exchange gas at a low pressure, preferably about 0.01 atmosphere.

The finished particles are highly porous particles wherein the pore openings at the surface of the particles are sealed with a thin coating which also covers the surfaces of the particles, and the pore chambers are filled with an inert gas at a low pressure. In other embodiments of the invention, subsequent modifications of the surface chemistry of the finished particles, for example by known chemical modification methods, may be carried to impart hydrophobic or hydrophilic properties to the surfaces of the particles, as required for particular applications.

The following example further illustrates aspects of the invention. It should be understood that the example is not intended to limit the invention, and that various changes may be made by those skilled in the art without changing the essential characteristics and the basic concepts of the invention. Unless otherwise indicated, all parts, percentages, ratios, etc., in the examples and the rest of the specification are in terms of weight.

EXAMPLE

Fine particles of silica aerogel available from Cabot Corporation (NANOGEL Product Number TLD 201), having a particle size in the range of 5 to 15 μm and a pore diameter of approximately 20 nm, were pressed into a tungsten grid using polished stainless steel dies and a manual press. The grid had dimensions of approximately 2 cm×3 cm with a thickness of 0.002 in. and 100 lines per inch.

The grid thus loaded with particles was placed on a substrate holder (1) in the flow tube (2) of a viscous flow reactor for ALD represented schematically in FIG. 1, in which (3) are heaters, (4) is a throttle valve, (5) is a mechanical pump drawing the gas flow through the flow tube, which has a 3.5 cm inside diameter and is approximately 60 cm long. Ultrahigh purity nitrogen (6) is supplied to mass flow controllers with maximum throughput of 500 sccm on the reactant lines for water (7), trimethylaluminum (TMA) (8) and tris(tert-pentoxy) silanol (9). Pulses of dionized water, semi-conductor grade (high purity) TMA, and high purity tris(tertpentoxy) silanol are alternately injected into the nitrogen carrier gas stream by gas switching valve units 10, (11) , and (12). The reactor is controlled through a personal computer equipped with analog and digital input/output boards. Further description of this reactor may be found in Elam et al., "Viscous flow reactor with quartz crystal microbalance for thin film growth by atomic layer deposition", Review of Scientific Instruments, 2003, 73(8), 2981-87.

$SiO_2$ was deposited on the aerogel particles in the above described reactor under the conditions set forth below:
Temperature: 175° C.
Nitrogen flow rate: 100 sccm
Base pressure: 0.65 Torr
Precursor heated to 130° C.
Deposition by viscous flow method consisting of the following successive stages:
1. Ten doses of 1 second each (400 mTorr each) of water, followed by a 45-second purge.
2. Fifteen doses of 2 seconds each (500 mTorr each) of TMA, followed by a 45-second purge.
3. Ten doses of 1 second each (400 mTorr each) of water, followed by a 45-second purge.
4. Fifteen doses of 2 seconds each (500 mTorr each) of TMA, followed by a 45-second purge.

5. Fifteen doses of 1 second each (500 mTorr each) of tris (tert-pentoxy) silanol, followed by a 120-second purge.

At the end of the deposition process the coated aerogel particles recovered from the grid were opaque white in appearance, as contrasted to the translucent white appearance of the uncoated aerogel particles.

The finished particles according to the invention present many advantages over untreated and uncoated particles. They are particularly useful in severe service environments because they are not fragile, but are durable and abrasion resistant. Their protective coating also prevents absorption of liquids, oils or other substances into the pore chambers, thus preventing the resultant loss of thermal insulating power.

Another advantage of the finished particles according to the invention is their coating can be made very thin, as thin as 10-30 nm, therefore adding little to the thermal conductivity of the porous material, especially when the coating material itself has an inherent low thermal conductivity.

The finished particles according to the invention can be incorporated into insulating compositions and components, or used as stand alone insulation material.

Other embodiments of the present invention will be apparent to those skilled in the art from consideration of the specification and practice of the invention disclosed herein. It is intended that the specification and examples be considered as illustrative only, with the true scope and spirit of the invention being indicated by the following claims.

What is claimed is:

1. Discrete coated porous particles comprising substrate particles each encapsulated in a protective, durable coating of a coating material selected from the group consisting of metal oxides, wherein
    the substrate particles are made of a material selected from the group consisting of amorphous silica aerogels, amorphous silica xerogels, carbon aerogels and carbon xerogels, and having a porosity of at least 80%,
    each of the substrate particles has a plurality of pore chambers filled with a gas which replaces air originally present in the pore chambers and has a thermal conductivity no higher than 0.0002598 W/cmK, and each substrate particle also has a plurality of pore openings on its surface which are sealed by the coating,
    the substrate particle has a particle size from 1 µm to 5 mm,
    the coating has a thickness of at most 0.5 mm, and
    the coating has a total volume of not more than 20% of the volume of the substrate particle.

2. Discrete coated porous particles as in claim 1, wherein the material of the substrate particles has a porosity of at least 90%.

3. Discrete coated porous particles as in claim 1, wherein the substrate particles have a particle size from 1 µm to 1,200 µm.

4. Discrete coated porous particles as in claim 1, wherein the substrate particles have a particle size from 1 µm to 500 µm.

5. Discrete coated porous particles as in claim 1, wherein the substrate particles have a particle size from 1 µm to 15 µm.

6. Discrete coated porous particles as in claim 1, wherein the substrate particles have a particle size from 1 mm to 5.0 mm.

7. Discrete coated porous particles as in claim 1, wherein the coating has a thickness of at most 40 nm.

8. Discrete coated porous particles as in claim 1, wherein the coating has a thickness of at most 20 nm.

9. Discrete coated porous particles as in claim 1, wherein the coating is $SiO_2$.

10. Discrete coated porous particles as in claim 1, wherein the coating is $SiO_2$ deposited by atomic layer deposition.

11. Discrete coated porous particles as in claim 1, wherein the gas is nitrogen.

12. Discrete coated porous particles as in claim 1, wherein the gas is xenon.

13. Discrete coated porous particles as in claim 1, wherein the gas filling the pore chambers is at a pressure of no more than 0.01 atmosphere.

14. Discrete coated porous particles as in claim 1, wherein the substrate particles are amorphous silica aerogel particles.

15. Discrete coated porous particles as in claim 1, wherein the substrate particles are amorphous silica xerogel particles.

16. Discrete coated porous particles as in claim 1, wherein the substrate particles are carbon aerogel particles.

17. Discrete coated porous particles as in claim 1, wherein the substrate particles are carbon xerogel particles.

18. A material made from discrete coated porous particles as in claim 1.

19. An article made from discrete coated porous particles as in claim 1.

20. A composition comprising discrete coated porous particles as in claim 1.

* * * * *